(12) United States Patent
Tokunaga et al.

(10) Patent No.: US 8,078,423 B2
(45) Date of Patent: Dec. 13, 2011

(54) DATA GENERATING METHOD, CONNECTION CHECKING SYSTEM, AND COMPUTER PRODUCT

(75) Inventors: Takakazu Tokunaga, Fukuoka (JP); Kouichi Tanda, Fukuoka (JP); Hiroaki Shiraishi, Fukuoka (JP); Yoshikatsu Kouhara, Fukuoka (JP); Koji Takatomi, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 11/859,040

(22) Filed: Sep. 21, 2007

(65) Prior Publication Data

US 2008/0097717 A1  Apr. 24, 2008

(30) Foreign Application Priority Data

Oct. 19, 2006  (JP) ................................. 2006-285542

(51) Int. Cl.
*G01R 31/3183* (2006.01)
(52) U.S. Cl. ......... 702/119; 702/120; 702/123; 714/725
(58) Field of Classification Search .......... 702/117–120, 702/123, 124; 326/38; 714/325
See application file for complete search history.

(56) References Cited

U.S. PATENT DOCUMENTS

| 4,484,329 | A | * | 11/1984 | Slamka et al. | ................. 714/734 |
| 5,740,086 | A | * | 4/1998 | Komoto | ........................ 702/120 |
| 7,509,547 | B1 | * | 3/2009 | Han et al. | ....................... 714/725 |

FOREIGN PATENT DOCUMENTS

| JP | 2004-151061 | 5/2004 |
| JP | 2006-268862 | 10/2006 |

OTHER PUBLICATIONS

Japanese Office Action mailed Jul. 12, 2011 for corresponding Japanese Application No. 2006-285542, with English-language translation.

* cited by examiner

*Primary Examiner* — Manuel L Barbee
(74) *Attorney, Agent, or Firm* — Fujitsu Patent Center

(57) ABSTRACT

A computer terminal retrieves pin data related to respective pins of a plurality of Field Programmable Gate Array that are mounted on a board. The computer terminal retrieves setting data related to a connection check. Upon retrieving the pin data and the setting data, the computer terminal assigns, as data for the connection check to all the pins that can output data, unique data that is unique to each pin. The computer terminal generates input pin data and output pin data containing the unique data, stores therein the input pin data and the output pin data, and generates checking circuits that check connections between output pins and input pins. The computer terminal generates checking data based on the checking circuits.

7 Claims, 14 Drawing Sheets

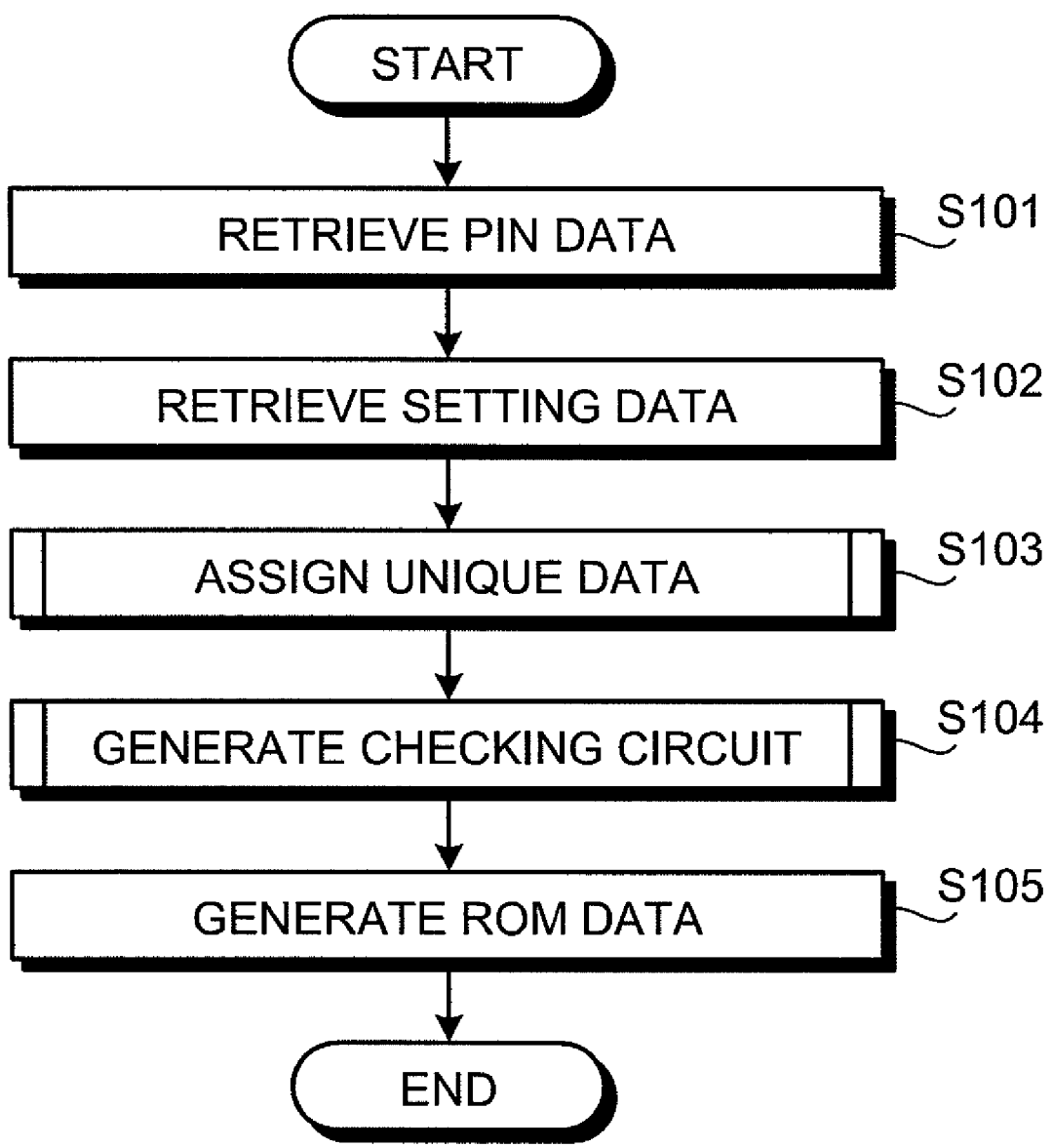

FIG.2

FPGA#1

|   | PIN NAME | BIT RANGE | INPUT/ OUTPUT | FORM | TYPE | SYNCHRONOUS CLOCK | CONNECTED FPGA | CONNECTED PIN NAME |
|---|----------|-----------|---------------|------|------|-------------------|----------------|--------------------|
| 1 | CLK      | 1         | I             | S    | CLOCK | -                | I/O            | CLK1               |
| 2 | F1_IDTA  | 3:0       | I             | V    | DATA | CLK               | I/O            | IDTA[3:0]          |
| 3 | F1_ODTA  | 15:0      | O             | V    | DATA | CLK               |                |                    |
| 4 | F1_ODTB  | 1:0       | O             | V    | DATA | CLK               |                |                    |

FPGA#2

|   | PIN NAME | BIT RANGE | INPUT/ OUTPUT | FORM | TYPE | SYNCHRONOUS CLOCK | CONNECTED FPGA | CONNECTED PIN NAME |
|---|----------|-----------|---------------|------|------|-------------------|----------------|--------------------|
| 1 | CLK      | 1         | I             | S    | CLOCK | -                | I/O            | CLK1               |
| 2 | F2_IDTA  | 3:0       | I             | V    | DATA | CLK               | FPGA#3         | F3_ODTB[3:0]       |
| 3 | F2_IDTB  | 15:0      | I             | V    | DATA | CLK               | I/O            | IDTB[15:0]         |
| 4 | F2_IDTC  | 31:0      | I             | V    | DATA | CLK               | I/O            | IDTC[31:0]         |
| 5 | F2_ODTA  | 6:0       | O             | V    | DATA | CLK               |                |                    |
| 6 | F2_ODTB  | 3:0       | O             | V    | DATA | CLK               | I/O            | ODTC[3:0]          |
| 7 | F2_ODTC  | 15:0      | O             | V    | DATA | CLK               |                |                    |
| 8 | F2_ODTD  | 15:0      | O             | V    | DATA | CLK               |                |                    |

FPGA#3

|   | PIN NAME | BIT RANGE | INPUT/ OUTPUT | FORM | TYPE | SYNCHRONOUS CLOCK | CONNECTED FPGA | CONNECTED PIN NAME |
|---|----------|-----------|---------------|------|------|-------------------|----------------|--------------------|
| 1 | CLK      | 1         | I             | S    | CLOCK | -                | I/O            | CLK1               |
| 2 | F3_IDTA  | 15:0      | I             | V    | DATA | CLK               | FPGA#1         | F1_ODTA[15:0]      |
| 3 | F3_IDTB  | 1:0       | I             | V    | DATA | CLK               | FPGA#1         | F1_ODTB[1:0]       |
| 4 | F3_IDTC  | 6:0       | I             | V    | DATA | CLK               | FPGA#2         | F2_ODTA{6:0]       |
| 5 | F3_ODTA  | 15:0      | IO            | V    | DATA | CLK               | I/O            | ODTA[15:0]         |
| 6 | F3_ODTB  | 3:0       | O             | V    | DATA | CLK               | I/O            | ODTB[3:0]          |

FPGA#4

|   | PIN NAME | BIT RANGE | INPUT/ OUTPUT | FORM | TYPE | SYNCHRONOUS CLOCK | CONNECTED FPGA | CONNECTED PIN NAME |
|---|----------|-----------|---------------|------|------|-------------------|----------------|--------------------|
| 1 | CLK      | 1         | I             | S    | CLOCK | -                | I/O            | CLK2               |
| 2 | F4_IDTA  | 15:0      | I             | V    | DATA | CLK               | FPGA#2         | F2_ODTD[15:0]      |
| 3 | F4_IDTB  | 3:0       | I             | V    | DATA | CLK               | I/O            | IDTD[3:0]          |
| 4 | F4_IDTC  | 3:0       | I             | V    | DATA | CLK               | FPGA#6         | F6_ODTB{3:0]       |
| 5 | F4_ODTA  | 31:0      | O             | V    | DATA | CLK               |                |                    |
| 6 | F4_ODTB  | 1         | O             | S    | DATA | CLK               |                |                    |

FIG.3

| | SETTING | SET VALUE |
|---|---|---|
| 1 | CLOCK SETTING<br>(0: FREQUENCY DIVIDING CLOCK, 1: ACTUAL SPEED CLOCK) | 0 |
| 2 | BI-DIRECTIONAL PIN CHECKING METHOD SETTING<br>(0: SINGLE DIRECTION MODE, 1:CONTROL CIRCUIT MODE,<br>2: TIMER CIRCUIT MODE ) | 0 |
| | ⋮ | |

FIG.5

FPGA#1

INPUT PIN DATA

| | PIN NAME | BIT RANGE | INPUT/OUTPUT | FORM | TYPE | SYNCHRONOUS CLOCK | CONNECTED FPGA | CONNECTED PIN NAME | COMPARISON DATA |
|---|---|---|---|---|---|---|---|---|---|
| 1 | F1_IDTA | 3:0 | I | V | DATA | CLK | I/O | IDTA[3:0] | 10000010 |

OUTPUT PIN DATA

| | PIN NAME | BIT RANGE | INPUT/OUTPUT | FORM | TYPE | SYNCHRONOUS CLOCK | UNIQUE DATA |
|---|---|---|---|---|---|---|---|
| 1 | F1_ODTA | 15:0 | O | V | DATA | CLK | 00010010 |
| 2 | F1_ODTB | 1:0 | O | V | DATA | CLK | 00010011 |

FPGA#3

INPUT PIN DATA

| | PIN NAME | BIT RANGE | INPUT/OUTPUT | FORM | TYPE | SYNCHRONOUS CLOCK | CONNECTED FPGA | CONNECTED PIN NAME | COMPARISON DATA |
|---|---|---|---|---|---|---|---|---|---|
| 1 | F3_IDTA | 15:0 | I | V | DATA | CLK | FPGA#1 | F1_ODTA[15:0] | 00010010 |
| 2 | F3_IDTB | 1:0 | I | V | DATA | CLK | FPGA#1 | F1_ODTB[1:0] | 00010011 |
| 3 | F3_IDTC | 6:0 | I | V | DATA | CLK | FPGA#2 | F2_ODTA[6:0] | 00100010 |
| 4 | F3_ODTA | 15:0 | I | V | DATA | CLK | I/O | ODTA[15:0] | 10000110 |

OUTPUT PIN DATA

| | PIN NAME | BIT RANGE | INPUT/OUTPUT | FORM | TYPE | SYNCHRONOUS CLOCK | UNIQUE DATA |
|---|---|---|---|---|---|---|---|
| 1 | F3_ODTA | 15:0 | O | V | DATA | CLK | 00110010 |
| 2 | F3_ODTB | 3:0 | O | V | DATA | CLK | 00110011 |

FIG.6

FPGA#0

INPUT PIN DATA

| | PIN NAME | BIT RANGE | INPUT/OUTPUT | FORM | TYPE | SYNCHRO-NOUS CLOCK | CONNECTED FPGA | CONNECTED PIN NAME | COMPARISON DATA |
|---|---|---|---|---|---|---|---|---|---|
| 1 | ODTA | 15:0 | I | V | DATA | CLK | FPGA#3 | F3_ODTA[15:0] | 00110010 |
| 2 | ODTB | 3:0 | I | V | DATA | CLK | FPGA#3 | F3_ODTB[3:0] | 00110011 |
| 3 | ODTC | 3:0 | I | V | DATA | CLK | FPGA#2 | F2_ODTB[3:0] | 00100010 |
| 4 | ODTD | 5:0 | I | V | DATA | CLK | FPGA#5 | F5_ODTA[5:0] | 01010010 |
| 5 | ODTE | 5:0 | I | V | DATA | CLK | FPGA#6 | F6_ODTA[5:0] | 01100010 |

OUTPUT PIN DATA

| | PIN NAME | BIT RANGE | INPUT/OUTPUT | FORM | TYPE | SYNCHRO-NOUS CLOCK | UNIQUE DATA |
|---|---|---|---|---|---|---|---|
| 1 | IDTA | 3:0 | O | V | DATA | CLK | 10000010 |
| 2 | IDTB | 15:0 | O | V | DATA | CLK | 10000011 |
| 3 | IDTC | 31:0 | O | V | DATA | CLK | 10000100 |
| 4 | IDTD | 3:0 | O | V | DATA | CLK | 10000101 |
| 5 | ODTA | 15:0 | O | V | DATA | CLK | 10000110 |

DATA GENERATING METHOD, CONNECTION CHECKING SYSTEM, AND COMPUTER PRODUCT

BACKGROUND OF THE INVENTION

1. Field of the Invention

The present invention relates to a technology for checking a connection between terminals of programmable devices.

2. Description of the Related Art

Recently, a programmable device such as a Field Programmable Gate Array (FPGA) is used for generating a prototype of an Application Specific Integrated Circuit (ASIC) that is an integrated circuit manufactured for a specific purpose. Specifically, because the FPGA is a Large Scale Integration (LSI), of which functions can be modified as appropriate by programming when designing the ASIC, the FPGA is used to generate a board logically equivalent to the ASIC to verify whether the ASIC realizes desired functions.

Generally, a plurality of the FPGAs connected with one another are mounted on the board used as the prototype of the ASIC. If connections between the FPGAs are physically disconnected, it is difficult to accurately verify a logic with the board having a logic equivalent to a logic of the ASIC, even when the logic of the ASIC is accurate. To overcome the drawback, a technology is disclosed in Japanese Patent Application Laid-open No. 2004-151061, in which data (usually called "Read Only Memory (ROM) data" or "BIT data" etc.) of a connection-checking program is written to the FPGA and the connections of the boards are checked before verifying the logic. In the technology disclosed in the Japanese Patent Application Laid-open No. 2004-151061, checking data for checking a connection is transacted between input/output pins of the FPGAs connected to one another, and if it is confirmed that the checking data is accurately input to the FPGA on a receiving side, an absence of a physical defect in the connection between the FPGAs is assured.

However, in the technology described above, although the connections between the FPGAs on the board can be checked, connections between the FPGA and devices externally connected to the board cannot be checked. In other words, although connectors for connecting the board to the external devices are arranged on a periphery of the board on which the FPGAs are mounted, the connectors are exclusively used as external terminals of the ASIC and hardly generates or compares the checking data for checking a connection. Therefore, it is difficult to check the connections between the connectors and the FPGA.

To overcome the drawback, a measuring device, such as an oscilloscope etc, can be externally connected to the board via the connector to check whether a connection is established between the connector and the FPGA by checking whether data is output from the FPGA connected to the connectors. In other words, if it is confirmed that the data is output from the connectors using the measuring device, it is determined that there is little physical defect between the FPGA and the connectors. However, due to high integration, a number of the input/output pins of the FPGA is increasing, increasing the number of the input/output pins connected to the connectors. Thus, it is more difficult to manually check the connections between all the input/output pins using the measuring device.

Furthermore, when using the measuring device, the connections are checked on the assumption that all the pins of the FPGAs, which are connected to the connectors, are output pins that output data. However, the pins of the FPGAs also include input pins that input data into the FPGA from the devices externally connected to the board via the connectors. Thus, it is difficult to check the connections based on actual functions.

Similarly, in the conventional technology, because whether each pin is the input pin or the output pin is not considered even when checking the connections between the FPGAs, it is difficult to check the connection based on the actual functions, when the pins are bi-directional pins that control and switch input/output.

SUMMARY OF THE INVENTION

It is an object of the present invention to at least partially solve the problems in the conventional technology.

According to an aspect of the present invention, there is provided a method of generating checking data to be written to programmable devices for checking a connection between terminals of the programmable devices. The method includes retrieving terminal data of the terminals of the programmable devices; assigning unique data to each terminal of the programmable devices with respect to each connection between the terminals based on the terminal data; generating, for each of the programmable devices, a checking circuit that checks the connection between the terminals based on the unique data; and generating the checking data corresponding to the checking circuit.

According to another aspect of the present invention, there is provided a connection checking system that includes a writing device that writes to programmable devices, checking data for checking a connection between terminals of the programmable devices; and a plurality of the programmable devices that work based on the checking data, and that are connected to one another on a board. The writing device includes a retrieving unit that retrieves terminal data of terminals of the programmable devices, an assigning unit that assigns, based on the terminal data, unique data to the terminals with respect to each connection between the terminals, a generating unit that generates, for each programmable device, a checking circuit that checks the connections between the terminals based on the unique data, and a writing unit that writes to the programmable devices, the checking data corresponding to the checking circuit, wherein the programmable devices check, based on the checking data, whether there is a failure in connections between terminals on the board.

According to still another aspect of the present invention, there is provided a computer-readable recording medium that stores therein a computer program that implements the above method on a computer.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a flowchart of a ROM data generating operation according to an embodiment of the present invention;

FIG. 2 is a schematic diagram of an example of pin data according to the embodiment;

FIG. 3 is a schematic diagram of setting data according to the embodiment;

FIG. 5 is a schematic diagram of an example of input pin data and output pin data according to the embodiment;

FIG. 6 is a schematic diagram of an example of the input pin data and the output pin data of an other FPGA according to the embodiment;

DETAILED DESCRIPTION OF THE PREFERRED EMBODIMENTS

Figure 4A:
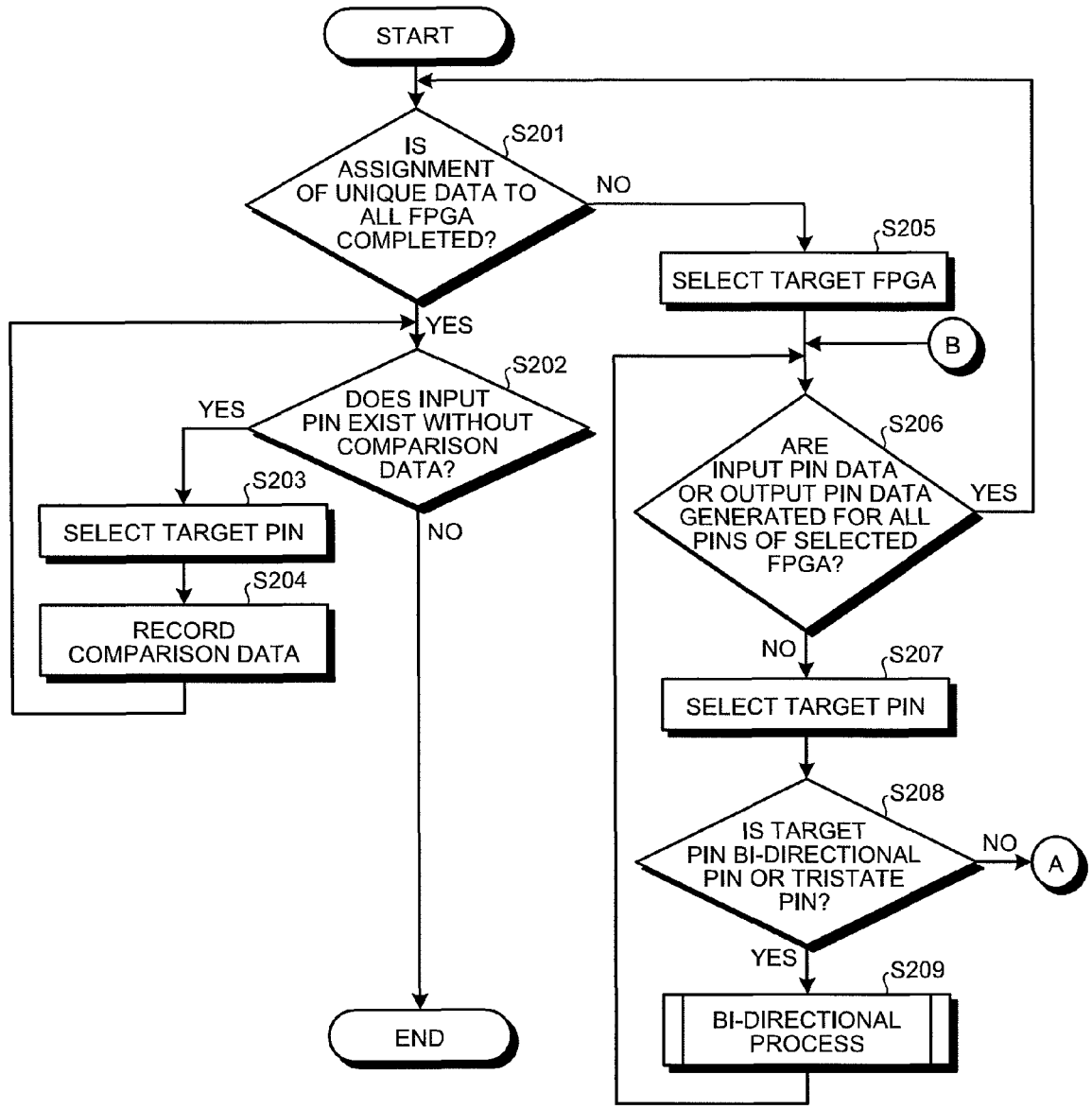
FIG. 4A is a flowchart of a unique-data assigning operation according to the embodiment.

Exemplary embodiments of the present invention are explained in detail below with reference to the accompanying drawings. Although Field Programmable Gate Arrays (FPGA) are explained below as an example of programmable devices, the present invention can be similarly applied when using various programmable devices such as a Programmable Logic Device (PLD) etc. Furthermore, in the embodiments explained below, data that is obtained by implementing a logic circuit and that is written (configured) to the programmable devices is called "Read Only Memory (ROM) data". In other words, the programmable devices operate similarly as the logic circuit that is converted into the ROM data.

FIG. 1 is a flowchart of a data generating operation of the ROM data according to an embodiment of the present invention. A flow shown in FIG. 1 is executed by a device such as a computer terminal etc. and the ROM data is generated. When the generated ROM data is configured in the FPGA, the FPGA checks connections related to all pins of the FPGA based on the ROM data.

When generating the ROM data, the device, such as the computer terminal, retrieves pin data related to the pins of a plurality of the FPGAs that are mounted on a board (step S101). The pin data contains, for each of the pins included in each of the FPGAs, data such as a pin name, information about whether the pin is an input pin or an output pin, information on the FPGA connected to the pin, and information about whether the pin is an external connection pin that connects the FPGA to an external device externally connected to the board. For example, if the FPGAs are used for a prototype of an Application Specific Integrated Circuit (ASIC), the pin data is defined based on a function of the ASIC. In other words, the pin data of each of the FPGAs is predefined based on connection relations between the FPGAs that are regulated by the functions performed by the entire board.

FIG. 2 is a schematic diagram of an example of the pin data of FPGAs 1 to 4. For example, data related to four pins of the FPGA 1 is stored in the pin data of the FPGA 1. The pin name of each of the pins corresponds to various data. To be specific, "bit range" indicates a bit width of data that is input and output from the pin. "Input/output" indicates whether the pin is the input pin (indicated by "I"), the output pin (indicated by "O"), or a bi-directional pin (indicated by "I/O"). "Connected FPGA" indicates the FPGA that is connected to the pin, and "connected pin name" indicates the pin name to which the pin is connected.

However, data of "connected FPGA" and "connected pin name" is stored exclusively for the input pins or the external connection pins that are classified as "I" or "I/O" in the column "input output". In other words, the FPGA which outputs data to the input pin or to the bi-directional pin is indicated by "connected FPGA" and the pin name of the pin that outputs data is indicated by "connected pin name". Furthermore, "connected FPGA" for the external connection pin is "I/O". By assuming an other FPGA that is externally connected to the board, a pin name of the other FPGA is stored as "connected pin name". For example, "connected FPGA" of a pin "F1_IDTA" of the FPGA 1 is "I/O", thus indicating that the pin "F1_IDTA" is the external connection pin. Furthermore, "connected pin name" of the pin "F1_IDTA" is a pin named "IDTA" of the other FPGA. Furthermore, a pin "CLK" of each FPGA is a pin that provides a clock from outside the board.

Upon retrieving the pin data of all the FPGAs on the board, the computer terminal retrieves setting data related to a connection check (step S102). Settings, which are used when checking the connections, are stored in the setting data in a format shown in FIG. 3. To be specific, for example, the setting data contains an instruction of whether to use a single direction mode, a control circuit mode, or a timer circuit mode as a checking method of the bi-directional pin that switches input/output. The single direction mode indicates a mode that checks the connections fixedly in a single direction of input and output even if the pin subjected to the connection check is the bi-directional pin. The control circuit mode indicates a mode that switches input/output of the bi-directional pin each time to check the connections. The timer circuit mode indicates a mode that switches input/output of the bi-directional pin for every predetermined time period to check the connections.

Upon retrieving the pin data and the setting data, the computer terminal, which generates the ROM data for the connection check, assigns to all the pins capable of outputting data, unique data as the connection checking data (step S103). Simultaneously, the computer terminal records in all the pins capable of inputting data, comparison data that is equivalent to the unique data assigned to connection source pins and that is expected to be input at the time of the connection check. In other words, the computer terminal assigns for the respective connections of all the pins, the unique data and the comparison data that are identifiable with the connections of the other pins after input/output are differentiated. Thus, if the checking method is the control circuit mode or the timer circuit mode, the unique data to be output is assigned to the bi-directional pins and the comparison data to be input is also recorded in the bi-directional pins.

Furthermore, apart from the FPGA on the board, the computer terminal also establishes a correspondence between the unique data and the comparison data of all the pins of the other FPGA that are assumed to be externally connected to the board. Next, the computer terminal generates for each FPGA, output pin data containing data of the unique data that is assigned to the output pins due to the assignment of the unique data. Similarly, the computer terminal generates for each FPGA, input data containing data of the comparison data that is recorded in the input pins.

Thus, in the present embodiment, the computer terminal refers to the pin data and the setting data, assigns the unique data to the output pins of all the FPGAs, records the comparison data in the corresponding input pins, and generates for the bi-directional pins, the input pin data and the output pin data based on the correspondence between the unique data and the comparison data. In other words, after differentiating input/output, the computer terminal assigns the unique data and the comparison data to the connections of all the pins, including the pins of the opposite FPGA. Due to this, by generating the ROM data containing the input pin data and the output pin data for each FPGA and configuring the ROM data in each FPGA, the computer terminal can check without omissions, the connections between all the FPGAs on the board according to the actual operation. Furthermore, in the present embodiment, because the computer terminal generates the input pin data and the output pin data related to the other FPGA, by arranging the other FPGA for the connection check and configuring the ROM data containing the input pin data and the output pin data, the computer terminal can also check the connections between the external connection pins of the FPGAs on the board and the connectors for connecting the board to external devices. A specific process sequence of unique data assignment is explained in detail later.

After the unique data is assigned to all the output pins and the comparison data is recorded in all the input pins, the computer terminal generates checking circuits that are logic circuits that include a memory, that store therein the generated input pin data and the output pin data, and that check the connections between the output pins and the input pins (step S104). When generating the checking circuits, the computer terminal refers to the setting data and generates the checking circuits according to the connection checking method for the bi-directional pins. In other words, based on whether to use the single direction mode, whether to use the control circuit mode, or whether to use the timer circuit mode for checking the bi-directional pins, the computer terminal generates different checking circuits. The checking circuits include an output circuit that outputs the unique data from the output pins of the FPGA and a comparing circuit that compares data that is input from the input pins of the FPGA with the comparison data, and outputs a checking result.

Upon generating the checking circuits, the computer terminal generates the ROM data for causing the FPGA to execute an operation similar to the operation of the checking circuits (step S105). In other words, the computer terminal implements the checking circuit that is generated for each FPGA and generates the ROM data for the connection check for each of the FPGAs. By configuring the generated ROM data in the respective FPGAs, the computer terminal can use the board including the multiple mounted FPGA and the other FPGA to check all the connections on the board. To be specific, for example, if all the checking results obtained in each of the FPGAs indicate absence of a defect, processes for lighting a Light Emitting Diode (LED) on the board or the like are enabled.

Figure 4B:
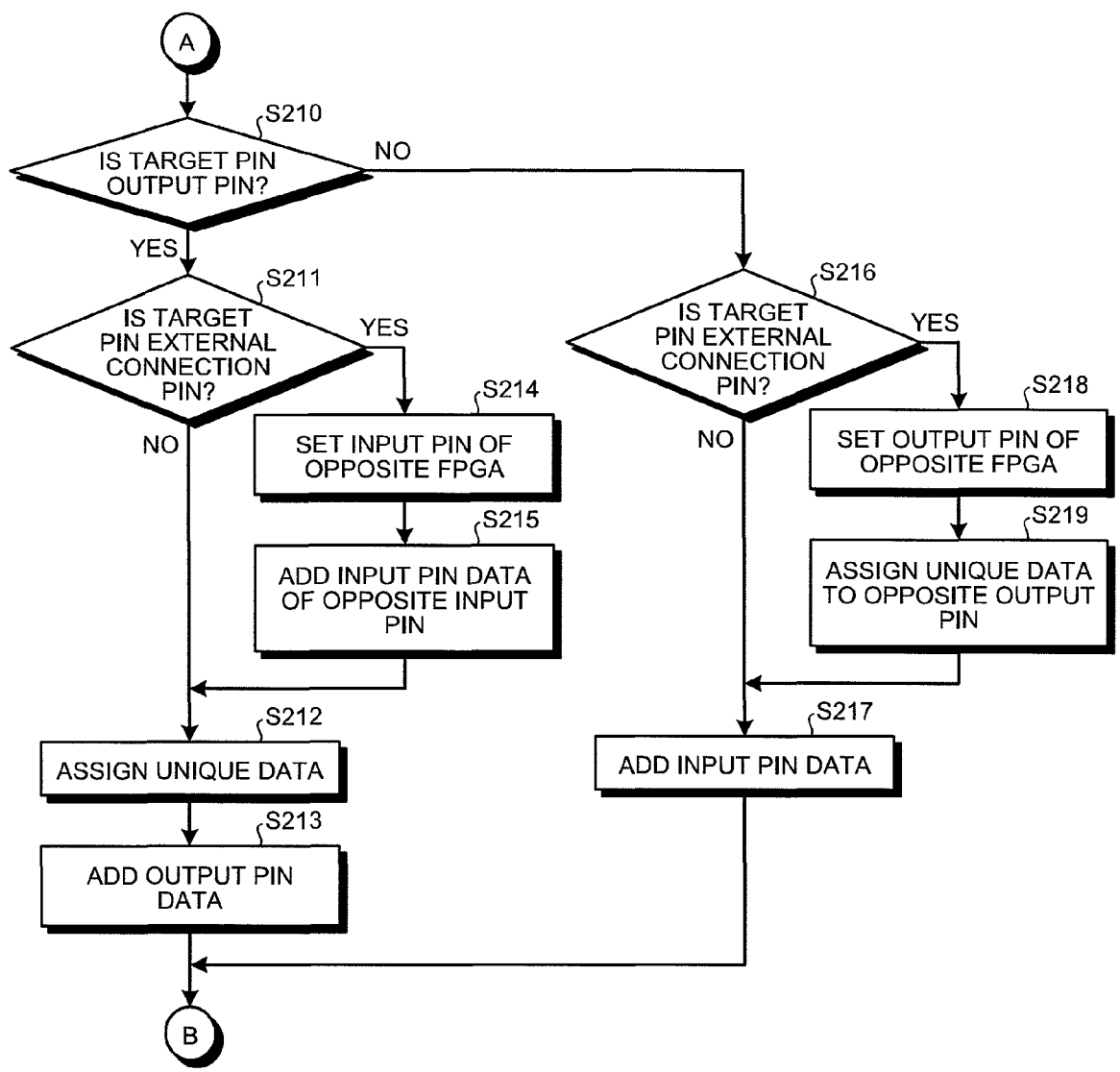
FIG. 4B is a continuation of the flowchart shown in FIG. 4A.

Next, a unique-data assigning process according to the embodiment is specifically explained. FIGS. 4A and 4B are flowcharts of an operation of unique data assignment to the output pins according to the embodiment.

When assigning the unique data to the output pins, the computer terminal, which generates the ROM data, retrieves the pin data of all the FPGAs on the board and the setting data containing the instruction related to the connection checking method of the bi-directional pins. Upon retrieving the ROM data and the setting data, the computer terminal determines whether assignment of the unique data to the output pins is completed (step S201). When the unique-data assigning process is not completed in any of the FPGAs (No at step S201), the computer terminal selects any one of the FPGAs on the board as a target FPGA (step S205). The computer terminal determines whether the input pin data or the output pin data are generated for all the pins of the selected FPGA (step S206). When a data generating process is not completed for any of the pins (No at step S206), the computer terminal selects any one of the pins of the FPGA as a target pin (step S207).

Upon selecting the target pin, based on the pin data, the computer terminal determines whether the target pin is the bi-directional pin or a tristate pin (step S208). In other words, from the pin data shown in FIG. 2, the computer terminal refers to "input/output" of the target pin and determines whether "I/O" is stored in the "input/output" column. The tristate pin indicates a pin that can opt for a treble status including a non-operational status in addition to input/output. If the target pin is the bi-directional pin or the tristate pin (Yes at step S208), the computer terminal refers to the setting data and executes a bi-directional process for generating the input pin data and the output pin data based on the checking method for the bi-directional pins (step S209). The bi-directional process is explained later.

If the target pin is not the bi-directional pin or the tristate pin (No at step S208, continued to A of FIG. 4B), based on the pin data, the computer terminal determines whether the pin is the output pin (step S210). In other words, in the pin data shown in FIG. 2, the computer terminal determines whether "input/output" of the target pin is "O". If the target pin is the output pin (Yes at step S210), the computer terminal further determines whether the target pin is the external connection pin connected to the connector of the board and not connected to the other FPGA (step S211). If the target pin is the output pin and not the external connection pin (No at step S211), the computer terminal assigns the unique data to the target pin (step S212), and further generates the output pin data containing a correspondence between the pin data and the unique data of the target pin (step S213). When checking the connection of the FPGA, the unique data is output from the output pin and used by the computer terminal as the connection checking data. The unique data is unique to all the output pins to enable identification of the output pins in all the FPGA on the board.

If the target pin is the output pin and also the external connection pin (Yes at step S211), because the data output from the target pin is input into the input pin of the other FPGA that is externally connected to the board, the computer terminal performs a setting to set up a new input pin in the other FPGA (step S214). The computer terminal uses the pin data of the connected target pin to further generate the input pin data of the newly set input pin of the other FPGA (step S215). To be specific, because the target pin is the external connection pin, a pin name of the other FPGA is stored in "connected pin name" of the target pin in the pin data shown in FIG. 2. Due to this, the computer terminal establishes a correspondence between the pin name and data, such as "bit range" and "input/output", of the target pin and uses the correspondence as the input pin data of the other FPGA. In the input pin data, "connected FPGA" is the FPGA that includes the target pin and "connected pin name" is the pin name of the target pin.

Even if the target pin is the external connection pin, the computer terminal assigns the unique data to the target pin (step S212) and further generates the output pin data containing a correspondence between the pin data and the unique data of the target pin (step S213).

Upon determining that the target pin is not the output pin (No at step S210), because the target pin is not the bi-directional pin, the tristate pin, or the output pin, thus implying that the target pin is the input pin, the computer terminal further determines whether the target pin is the external connection pin (step S216). If the target pin is the input pin and not the external connection pin (No at step S216), the computer terminal further generates the input pin data containing the pin data of the target pin (step S217).

If the target pin is the input pin and the external connection pin (Yes at step S216), because the data input into the target pin is output from the output pin of the other FPGA provided outside the board, the computer terminal performs a setting to newly set up an output pin in the other FPGA (step S218). The computer terminal assigns the unique data to the newly set output pin of the other FPGA (step S219), and further generates the output pin data of the other FPGA, in which the output pin data of the other FPGA obtained from the pin data of the target pin is associated with the unique data. Even if the target pin is the external connection pin, the computer terminal further generates the input pin data containing the pin data of the target pin (step S217).

Using the process mentioned above, upon generating the input pin data or the output pin data of the target pin (continued to B of FIG. 4A), the computer terminal once again determines whether the input pin data or the output pin data are generated for all the pins (step S206) and repeats the process until the input pin data or the output pin data are generated for all the pins of the selected FPGA. After the process is completed for all the pins (Yes at step S206), the computer terminal once again determines whether all the FPGA are subjected to the unique-data assigning process (step S201) and repeats the unique-data assigning process until the input pin data or the output pin data are generated for all the FPGA on the board. After completing the unique-data assigning process related to all the FPGAs (Yes at step S201), the computer terminal refers to the generated input pin data and determines whether there is an input pin that does not contain the recorded comparison data to be compared with the unique data during the connection check (step S202).

In the output pin data, although a correspondence is established between the unique pin data and all the output pins, a correspondence is not established in the input pin data between the comparison data and any of the input pins. Due to this, the computer terminal selects one input pin as the target pin from all the input pin data (step S203). Next, the computer terminal confirms "connected pin name" in the input pin data of the target pin and searches the output pin data of the output pin having the pin name that is stored in "connected pin name". Because the unique data of the output pin is already determined in the searched output pin data, and the unique data is input into the target input pin during the connection check, the computer terminal records the searched unique data as the comparison data in the input pin data of the target input pin (step S204). As a result, the unique data of the output pin matches with the comparison data of the input pin, which are connected to each other.

The computer terminal sequentially selects as the target input pins, the input pins for which the comparison data is not recorded in the input pin data. After the comparison data is associated for each of the input pins (No at step S202), the computer terminal completes the unique-data assigning process. Examples of the input pin data and the output pin data, which are generated due to a series of the processes mentioned earlier, are shown in FIG. 5. The examples of the input pin data and the output pin data of the FPGA 1 and the FPGA 3 are shown in FIG. 5. The input pin data and the output pin data shown in FIG. 5 are generated from the pin data shown in FIG. 2. As shown in FIG. 5, the comparison data of the input pin data matches with the unique data of the output pin data of the connected output pin. In other words, for example, because the input pin "F3_IDTA" of the FPGA 3 is connected to the output pin "F1_ODTA" of the FPGA 1, the unique data of "F1_ODTA" and the comparison data of "F3_IDTA" are "00010010", thus matching with each other.

Furthermore, in the above series of the processes, the computer terminal also generates the input pin data and the output pin data of the other FPGA that is externally connected to the board. FIG. 6 is a schematic diagram of an example of the input pin data and the output pin data of an FPGA 0 that is the other FPGA. Although the FPGA 0 is not mounted on the board, the FPGA 0 is externally connected to the board during the connection check, and the computer terminal executes the connection check between the input/output pins of all the FPGA including the FPGA 0. Due to this, even in the input pin data of the FPGA 0, the comparison data matches with the unique data of the output pin data of the connected output pin. In other words, for example, because the input pin "ODTB" of the FPGA 0 is connected to the output pin "F3_ODTB" of the FPGA 3 (see FIG. 5), the unique data of "F3_ODTB" and the comparison data of "ODTB" are "00110011", thus matching with each other.

Figure 7:
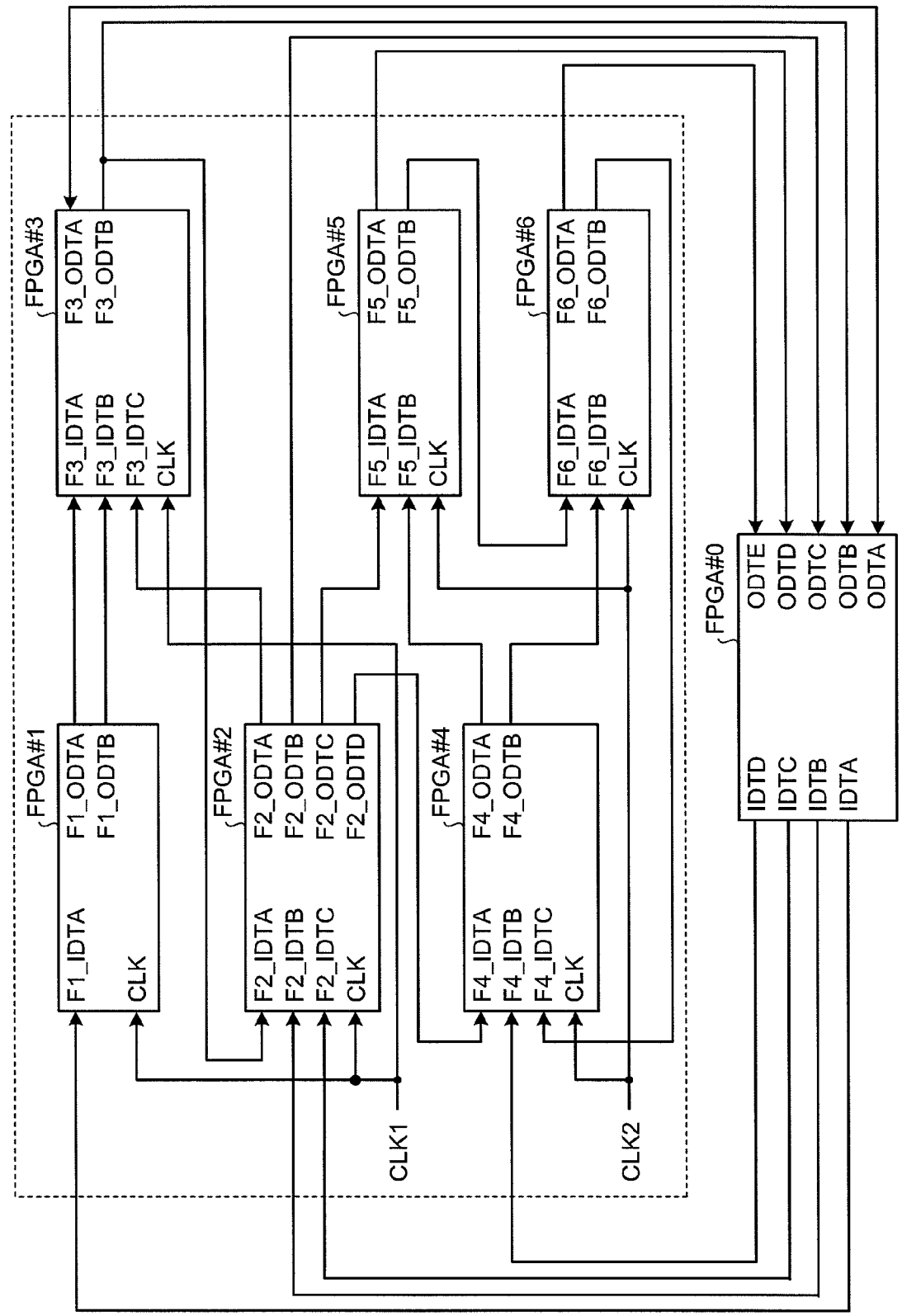
FIG. 7 is a block diagram of connections between the FPGAs according to the embodiment.

Thus, generating the input pin data and the output pin data from the pin data of the FPGA on the board enables the computer terminal to clearly grasp the connection relations between the FPGA, and assuming the other FPGA enables the computer terminal to list the connections between all the input/output pins. Due to this, as shown in FIG. 7, the computer terminal can accurately grasp the connections between all the FPGA including the FPGA 0 that is the other FPGA and can reliably prevent a check omission during the connection check. Furthermore, as shown in FIG. 7, directions of input/output of data between the respective input/output pins are made clear and the directions are the same as the directions at the time of actual operation of the respective FPGA. Due to this, the connection check based on the actual operation of the respective FPGA can be realized.

Figure 8A:
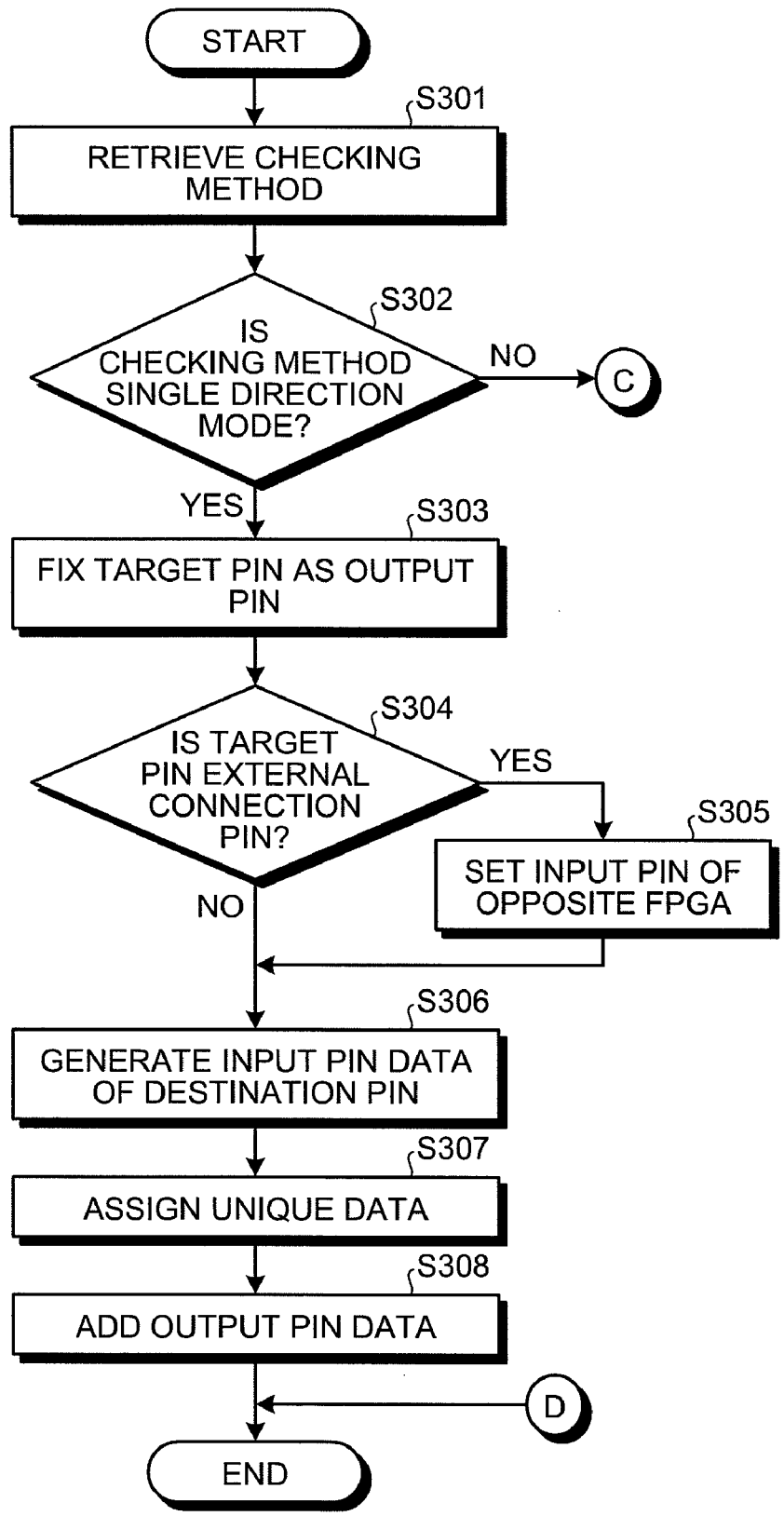
FIG. 8A is a flowchart of a bi-directional process according to the embodiment.
Figure 8B:
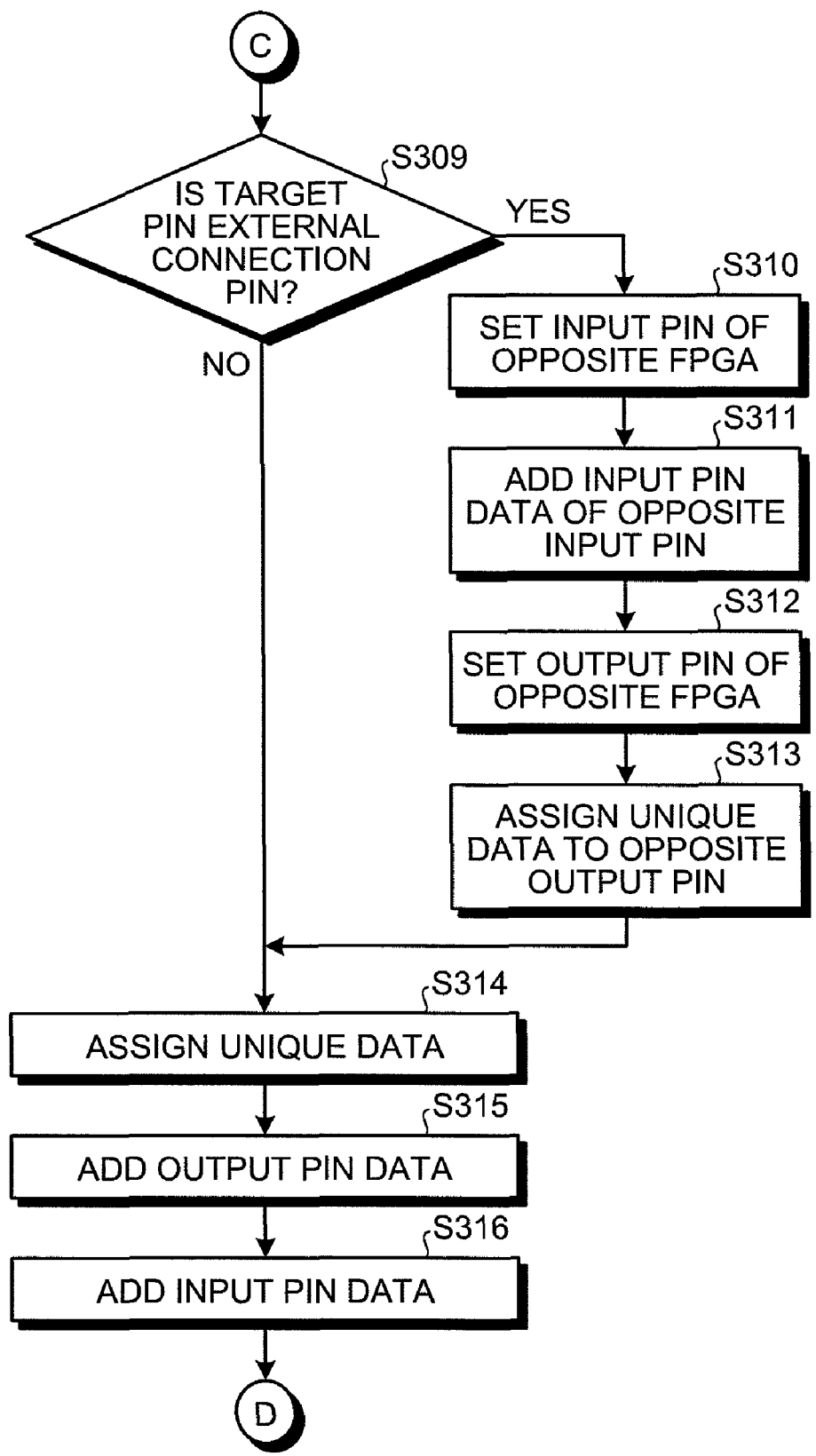
FIG. 8B is a continuation of the flowchart shown in FIG. 8A.

The bi-directional process during the unique data assignment when the target pin is the bi-directional pin or the tristate pin is explained with reference to FIGS. 8A and 8B.

If the target pin is the bi-directional pin or the tristate pin, the computer terminal refers to the setting data and retrieves the checking method of the bi-directional pin (or the tristate pin) (step S301). For example, in the setting data shown in FIG. 3, any one of the single direction mode, the control circuit mode, and the timer circuit mode can be set as the checking method of the bi-directional pin (or the tristate pin). The computer terminal determines whether the checking method is the single direction method (step S302). If the checking method is the single direction method (Yes at step S302), the computer terminal fixes the target pin as the output pin (step S303). In other words, even if the target pin is the bi-directional pin (or the tristate pin), because the single direction mode is the checking method that fixes the direction of input/output of data to one direction and performs the connection check, the computer terminal determines the target pin as the output pin and determines the pin connected to the target pin as the input pin. The computer terminal rewrites the pin data of the target pin and the pin data of the pin that is connected to the target pin, and fixes the target pin and the connected pin as the output pin and the input pin, respectively.

The computer terminal determines whether the target pin is the external connection pin that is connected to the connector of the board and not connected to the other FPGA (step S304). If the target pin is the external connection pin (Yes at step S304), because the data output from the target pin is input into the other FPGA that is externally connected to the board, the computer terminal performs the setting to set up a new input pin in the other FPGA (step S305). If the target pin is not the external connection pin (No at step S304), or if the target pin is the external connection pin and the input pin of the outside FPGA is newly set, the computer terminal uses the pin data of the target pin to generate the input pin data of the pin that is connected to the target pin (step S306). To be specific, because the target pin is the bi-directional pin (or the tristate pin), in the pin data shown in FIG. 2, a pin name of a destination pin is stored in "connected pin name" of the target pin. The computer terminal associates the pin name with data, such as "bit range" and "input/output", of the target pin and sets associated data as the input pin data of the destination pin. In the input pin data, "connected FPGA" is the FPGA that includes the target pin and "connected pin name" is the pin name of the target pin.

The computer terminal assigns the unique data to the target pin (step S307) and further generates the output pin data, in which the pin data is associated with the unique data of the target pin (step S308). Thus, even if the connection is between the bi-directional pins (the tristate pins), similarly to the instance when one of the pins is the output pin and the other pin is the input pin, the computer terminal generates the input pin data and the output pin data.

Based on a result of determining whether the checking method is the single direction mode, if the checking method is the control circuit mode or the timer circuit mode (No at step S302, continued to C of FIG. 8B), the target pin can be either the output pin or the input pin. The computer terminal determines whether the target pin is the external connection pin (step S309). If the target pin is the external connection pin (Yes at step S309), because the data output from the target pin is input into the other FPGA that is externally connected to the board, the computer terminal performs the setting to newly set up an input pin in the other FPGA (step S310). The computer terminal uses the pin data of the connected target pin to further generate the input pin data of the newly set input pin of the other FPGA (step S311).

Because the target pin is the bi-directional pin (or the tristate pin), the newly set input pin is also the bi-directional pin (or the tristate pin) and also operates as the output pin. Due to this, the computer terminal carries out the setting to newly set up an output pin in the other FPGA (step S312). However, the newly set output pin is actually the same as the input pin included earlier. Thus, one of the newly set pins functions as the input pin as well as the output pin. The computer terminal assigns the unique data to the newly set output pin of the other FPGA (step S313) and further generates the output pin data of the other FPGA in which data of the output pin of the other FPGA that is obtained from the pin data of the target pin is associated with the unique data. Due to this, both the input pin data and the output pin data are generated for a single bi-directional pin (or the tristate pin) of the other FPGA.

If the target pin is not the external connection pin (No at step S309) or if the target pin is the external connection pin and the input pin and the output pin of the other FPGA are newly set, the computer terminal assigns the unique data to the target pin as the output pin (step S314) and further generates the output pin data, in which the pin data is associated with the unique data of the output pin (step S315). Moreover, because the target pin is the output pin and simultaneously also operates as the input pin, the computer terminal further generates the input pin data containing the pin data of the target pin (step S316).

Due to the process mentioned earlier, if the selected target pin is the bi-directional pin (or the tristate pin) and the connection checking method is the single direction mode, the computer terminal fixes the target pin as the output pin and generates the output pin data. If the connection checking method is a mode other than the single direction mode, the computer terminal generates both the input pin data and the output pin data for the target pin. Thus, even if the target pin is the bi-directional pin (or the tristate pin), during the connection check, the computer terminal can list each individual connection for checking as the input pin data and the output pin data, and can reliably prevent a check omission during the connection check. Furthermore, if a method other than the single direction mode is used as the connection checking method, the computer terminal executes the connection check for both the input and the output of data by the bi-directional pin (the tristate pin). Thus, the computer terminal can check the connections according to the actual operation of each of the FPGAs.

Figure 9:
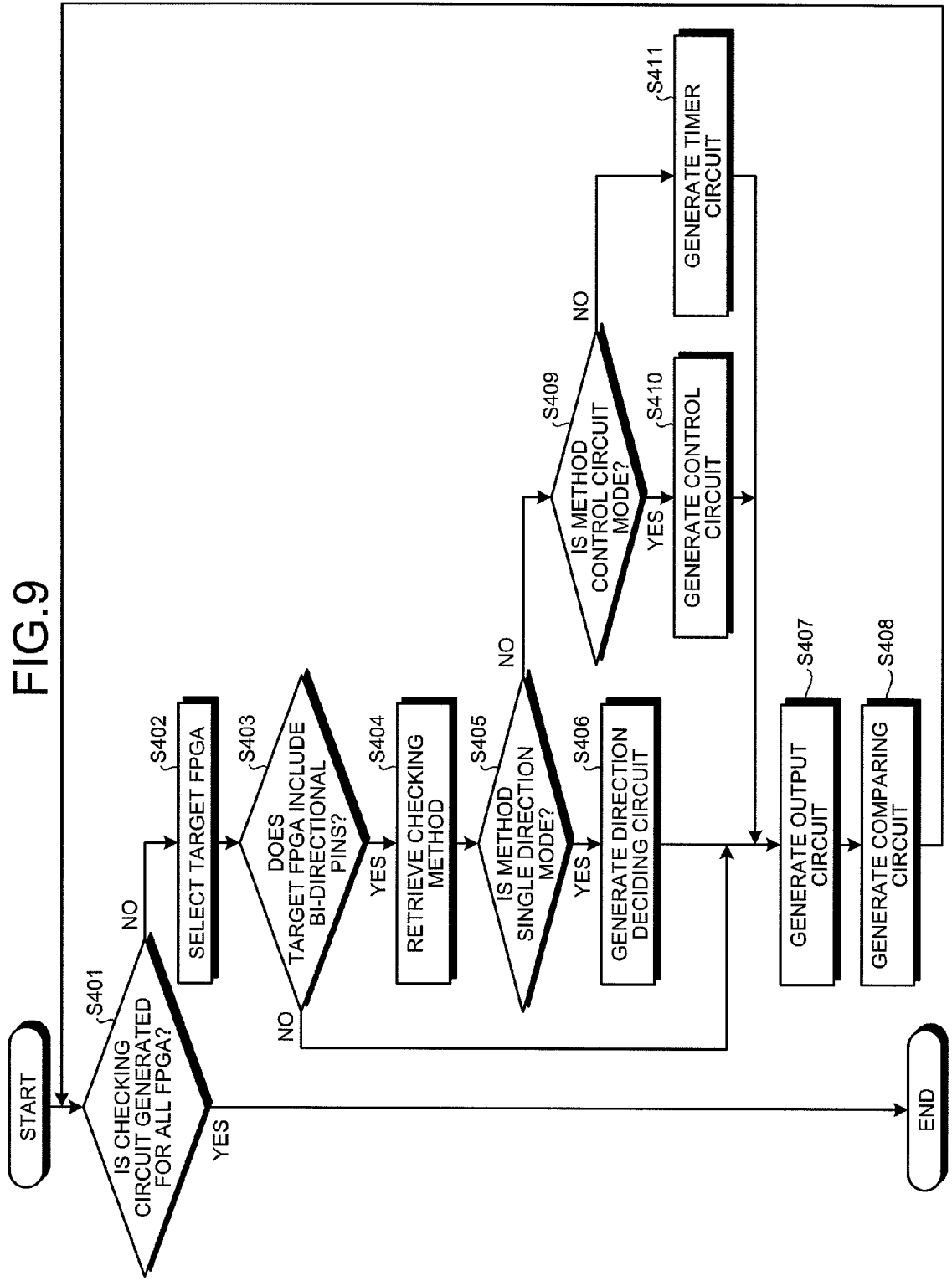
FIG. 9 is a flowchart of a checking-circuit generating operation according to the embodiment.

A checking circuit generating process according to the embodiment is explained in detail. FIG. 9 is a flowchart of an operation of checking circuit generation according to the embodiment. In the embodiment, by implementing the generated checking circuits, the computer terminal generates the ROM data for causing each FPGA to execute the connection check.

When generating the checking circuits, the computer terminal, which generates the ROM data, generates the input pin data and the output pin data of all the FPGA including the other FPGA. Upon generating the input pin data and the output pin data, the computer terminal determines whether the checking circuit generation related to all the FPGAs is completed (step S401). Because the checking circuit generating process is not completed for any of the FPGA (No at step S401), the computer terminal selects as the target FPGA, a single FPGA from all the FPGA including the other FPGA (step S402). The computer terminal refers to the pin data of the target FPGA and determines whether the target FPGA includes the bi-directional pins (step S403). In other words, the computer terminal determines whether "I/O" is stored in the "input/output" column of the pin data shown in FIG. 2.

If all the pins in the target FPGA are the input pins or the output pins and the target FPGA does not include any bi-directional pin (No at step S403), the computer terminal generates the output circuit that outputs, from each output pin, the unique data included in the output pin data of the target FPGA (step S407). The computer terminal further generates the comparing circuit that compares the comparison data contained in the input pin data of the target FPGA with data that is input from each input pin (step S408). The computer terminal also generates the memory that stores therein the input pin data and the output pin data such that the output circuit and the comparing circuit can refer to the memory. Thus, by configuring functions of the generated checking circuit in the FPGA as the ROM data, the computer terminal can obtain connection checking results in the comparing circuit of each of the FPGAs and can check the connections that connect all the FPGA on the board and the other FPGA to each other.

If the target FPGA includes the bi-directional pins (Yes at step S403), the computer terminal refers to the setting data and retrieves the checking method for the bi-directional pins (step S404). The computer terminal determines whether the checking method for the pins is the single direction mode (step S405). If the checking method is the single direction mode (Yes at step S405), the computer terminal generates a direction deciding circuit for ensuring that the unique data included in the output pin data is output from the bi-directional pin of the target FPGA, and that data is not output from a bi-directional pin connected to the bi-directional pin (step S406). Furthermore, similarly to the FPGA that does not include the bi-directional pins, the computer terminal generates the output circuit that outputs the unique data (step S407) and generates the comparing circuit that compares data input from the input pin with the comparison data (step S408).

Figure 10:
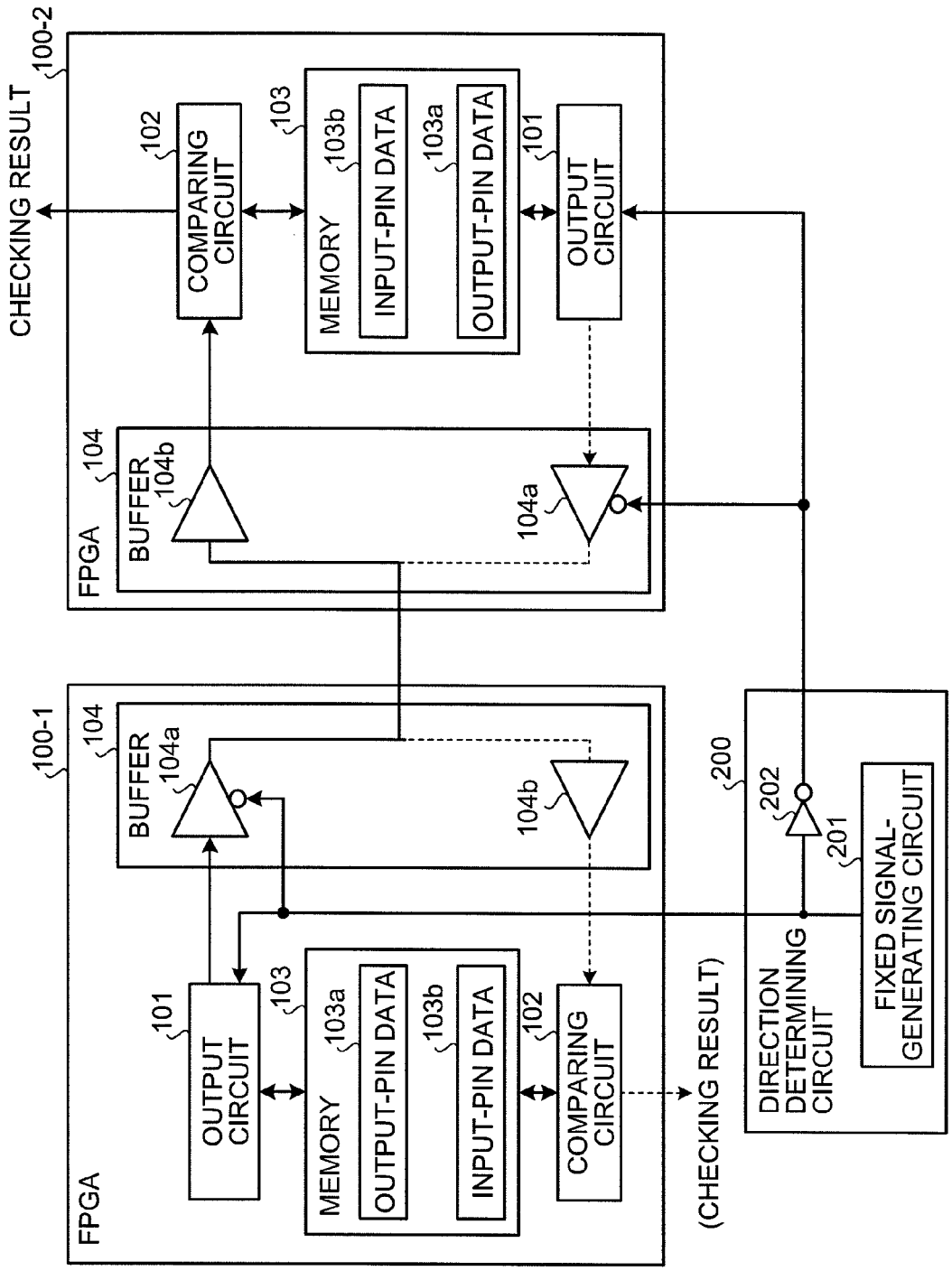
FIG. 10 is a block diagram of an example of a bi-directional-pin checking circuit according to the embodiment.

FIG. 10 is a block diagram of an example of the checking circuit when the checking method for the bi-directional pin is the single direction mode. As shown in FIG. 10, an FPGA 100-1 is the target FPGA and a bi-directional pin of another FPGA 100-2 is a destination pin of the bi-directional pin of the FPGA 100-1.

If the checking method for the bi-directional pins is the single direction mode, the computer terminal generates a direction determining circuit 200 for controlling the output of the unique data from the FPGAs 100-1 and 100-2. The direction determining circuit 200 can be generated on the target FPGA 100-1 and can be also generated on the other FPGA including the FPGA 100-2. The direction determining circuit 200 includes a fixed signal-generating circuit 201 and an inverter 202.

The fixed signal-generating circuit 201 generates unique signals for outputting the unique data from the target FPGA 100-1. To be specific, for example, the fixed signal-generating circuit 201 fixedly generates ON signals for operating an output circuit 101 and an output amplifier 104a inside the FPGA 100-1. The inverter 202 inverts the fixed signals that are generated by the fixed signal-generating circuit 201 and stops the output of the unique data by the FPGA 100-2. To be specific, for example, the inverter 202 inverts to OFF signals, the ON signals that are generated by the fixed signal-generating circuit 201 and supplies the OFF signals to the output circuit 101 and the output amplifier 104a inside the FPGA 100-2.

The FPGAs 100-1 and 100-2 include the output circuit 101, a comparing circuit 102, a memory 103, and a buffer 104. Even if the target FPGA does not include the bi-directional pins, a structure of the checking circuit is similar to the structure of the checking circuit inside the FPGAs 100-1 and 100-2 shown in FIG. 10.

The output circuit 101 refers to output-pin data 103a that is stored in the memory 103 and causes the respective output pins to be output via the buffer 104, the unique data that corresponds to each output pin. When the fixed signal-generating circuit 201 of the direction determining circuit 200 supplies the ON signals, the output circuit 101 causes the output pins to output the unique data.

When data is input from the input pin via the buffer 104, the comparing circuit 102 refers to input-pin data 103b that is stored in the memory 103 and compares the input data with the comparison data corresponding to the input pin. If the input data matches with the comparison data, the computer terminal outputs a checking result to the effect that the connection is not defective. Because the bi-directional pin of the FPGA 100-1 is fixed as the output pin, data is not input into the bi-directional pin. The comparing circuit 102 operates only when data is input from the input pin of the FPGA 100-1 or the bi-directional pin that is fixed as the input pin.

The memory 103 contains the output-pin data 103a and the input-pin data 103b. The output-pin data 103a and the input-pin data 103b are generated at the time of the unique data assignment to the output pins of each FPGA.

The buffer 104 causes the output pin or the bi-directional pin fixed as the output pin to output the unique data from the output circuit 101 and inputs into the comparing circuit 102, data from the input pin or the bi-directional pin fixed as the input pin. To be specific, the buffer 104 includes the output amplifier 104a and an input amplifier 104b. The output amplifier 104a and the input amplifier 104b cause the respective pins to carry out input/output of data. Because the bi-directional pin of the FPGA 100-1 is fixed as the output pin, the fixed signal-generating circuit 201 of the direction determining circuit 200 supplies the ON signals to the output amplifier 104a. Due to this, the output amplifier 104a of the FPGA 100-1 causes the output pin to output the unique data, data is not input into the bi-directional pin, and the input amplifier 104b does not operate.

Referring back to FIG. 9, if the checking method of the bi-directional pins is not the single direction mode (No at step S405), the computer terminal further determines whether the checking method of the bi-directional pins is the control circuit mode (step S409). If the checking method is the control circuit mode (Yes at step S409), the computer terminal generates a control circuit for switching input/output of the bi-directional pins when the checking results are output from the comparing circuits 102 of the FPGAs 100-1 and 100-2 that are connected to each other (step S410). Similarly to the FPGA that does not include the bi-directional pins, the computer terminal generates the output circuit that outputs the unique data (step S407) and further generates the comparing circuit that compares data input from the input pin with the comparison data (step S408).

Figure 11:
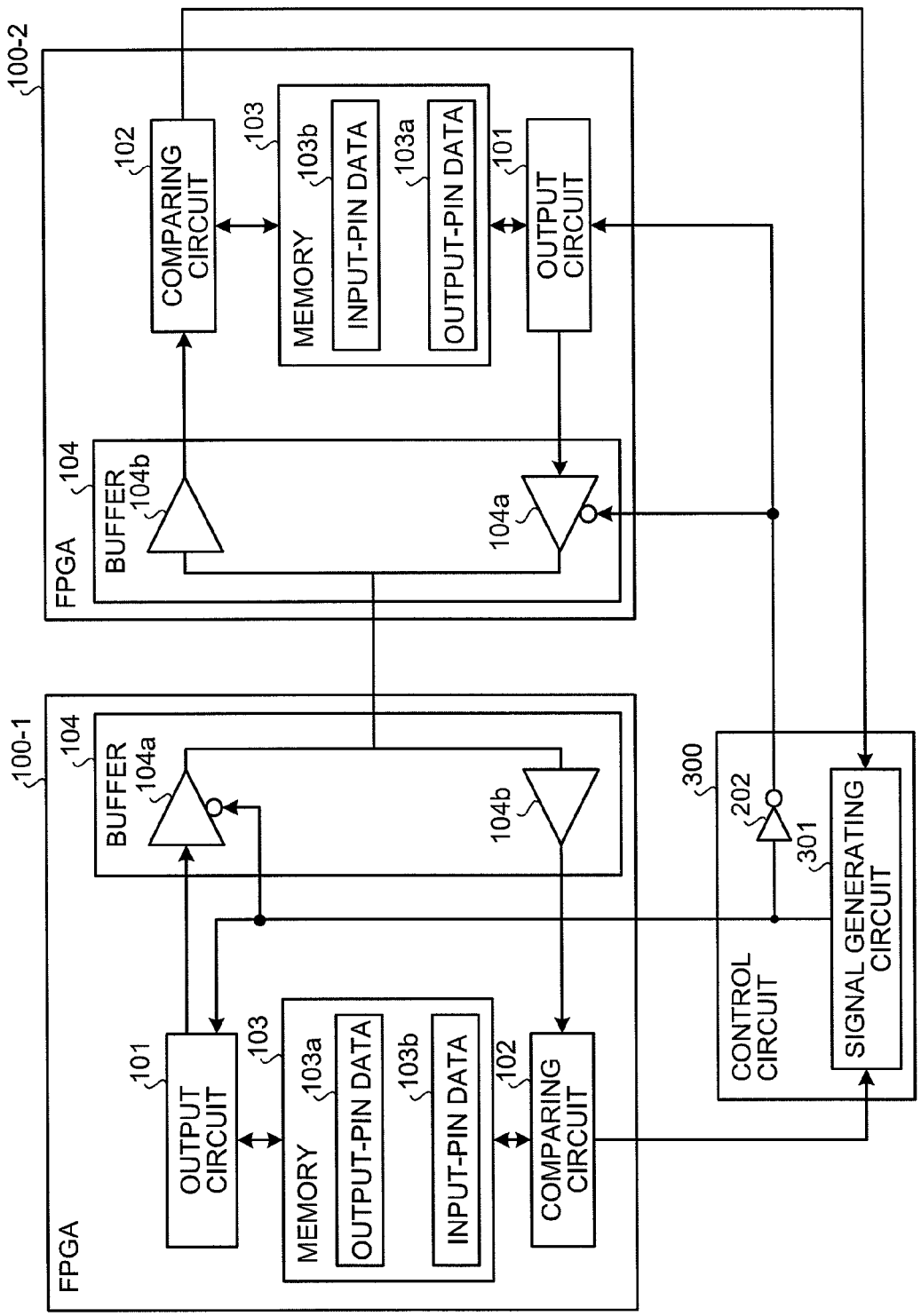
FIG. 11 is a block diagram of another example of the bi-directional-pin checking circuit according to the embodiment.

FIG. 11 is a block diagram of an example of the checking circuit when the checking method for the bi-directional pins is the control circuit mode. Components that are the same as the components shown in FIG. 10 are indicated by the same reference numerals and an explanation is omitted. As shown in FIG. 11, the FPGA 100-1 is the target FPGA and the bi-directional pin of the other FPGA 100-2 is the destination pin of the bi-directional pin of the FPGA 100-1.

If the checking method for the bi-directional pins is the control circuit mode, the computer terminal generates a control circuit 300 for controlling the output of the unique data from the FPGAs 100-1 and 100-2. The control circuit 300 can be generated on the target FPGA 100-1, and can be also generated on the other FPGA including the FPGA 100-2. The control circuit 300 includes a signal generating circuit 301 and the inverter 202.

The signal generating circuit 301 generates control signals that switch output and non-output of the unique data from the target FPGA 100-1. To be specific, for example, the signal generating circuit 301 generates the ON signals for operating the output circuit 101 and the output amplifier 104a inside the FPGA 100-1. Subsequently, when the connection checking results are output from the comparing circuit 102 of the FPGA 100-2, the signal generating circuit 301 generates the OFF signals for stopping the output circuit 101 and the output amplifier 104a inside the FPGA 100-1. In other words, when the checking results are output from the comparing circuits 102 of the FPGA 100-1 or the FPGA 100-2, the signal generating circuit 301 inverts the generated control signals.

Because the signal generating circuit 301 generates the control signals while switching the control signals, the control circuit 300 outputs the OFF signals to the FPGA 100-2 during the time period when outputting the ON signals to the FPGA 100-1, and outputs the ON signals to the FPGA 100-2 during the time period when outputting the OFF signals to the FPGA 100-1. Because the control circuit 300 executes the switching mentioned above when the checking results are output from the comparing circuits 102, the computer terminal can reliably check the connections when data is output from the bi-directional pins and also when data is input into the bi-directional pins.

Referring back to FIG. 9, if the checking method for the bi-directional pins is not the control circuit mode (No at step S409), thus indicating that the checking method is the timer circuit mode, the computer terminal generates a timer circuit for switching, during each predetermined time period, input/output of the bi-directional pins of the FPGAs 100-1 and 100-2 that are connected to each other (step S411). Furthermore, similarly to the FPGA that does not include any bi-directional pins, the computer terminal generates the output circuit that outputs the unique data (step S407) and further generates the comparing circuit that compares data input from the input pins with the comparison data (step S408).

Figure 12:
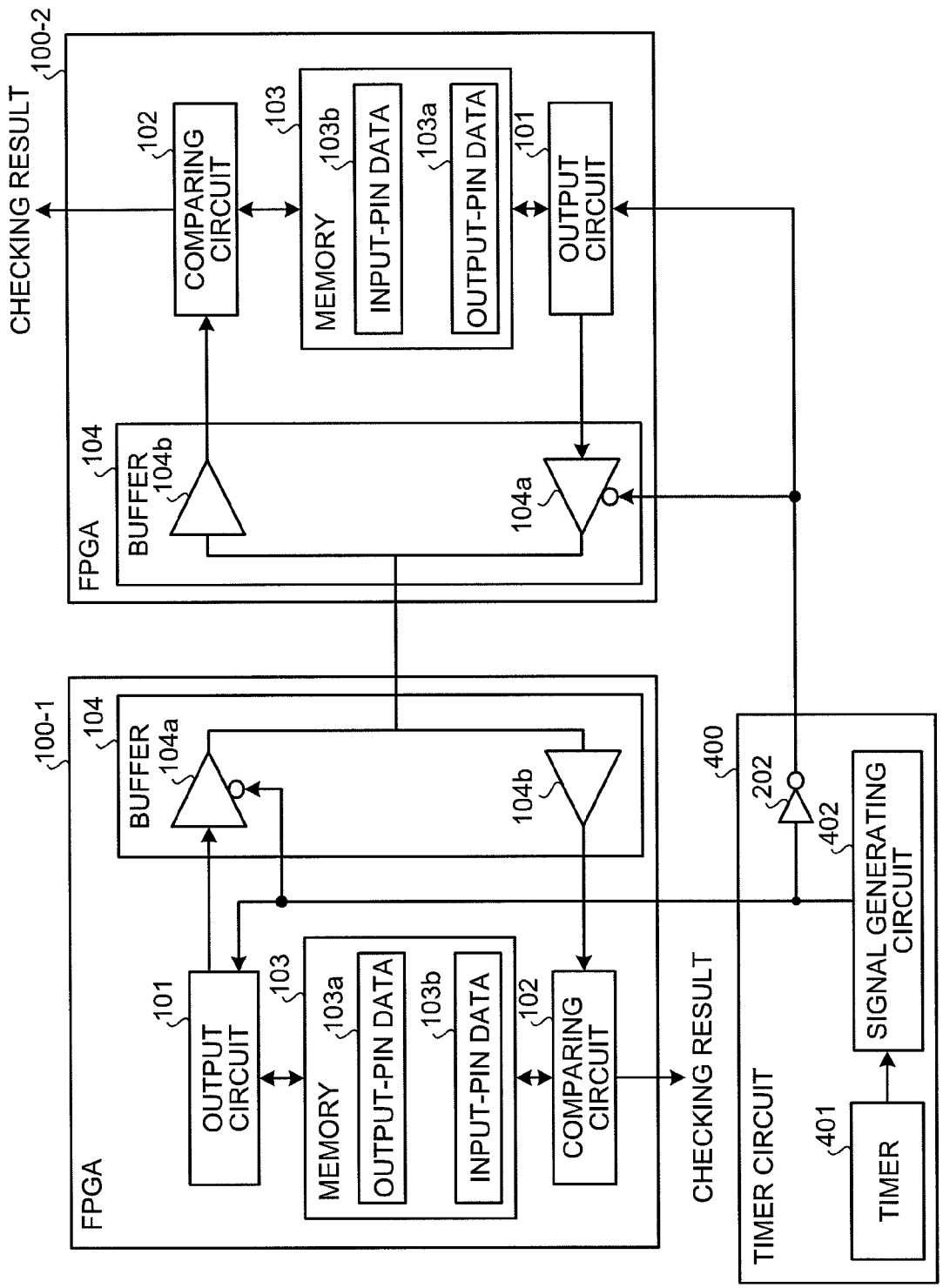
FIG. 12 is a block diagram of still another example of the bi-directional-pin checking circuit according to the embodiment.

FIG. 12 is a block diagram of an example of the checking circuit when the checking method for the bi-directional pins is the timer circuit mode. Components that are the same as the components shown in FIG. 10 are indicated by the same reference numerals and an explanation is omitted. As shown in FIG. 12, the FPGA 100-1 is the target FPGA and the bi-directional pin of the other FPGA 100-2 is the destination pin of the bi-directional pin of the FPGA 100-1.

If the checking method for the bi-directional pins is the timer circuit mode, the computer terminal generates a timer circuit 400 for controlling the output of the unique data from the FPGAs 100-1 and 100-2. The timer circuit 400 can be generated on the target FPGA 100-1 and can be also generated on the other FPGA including the FPGA 100-2. The timer circuit 400 includes a timer 401, a signal generating circuit 402, and the inverter 202.

The timer 401 counts the predetermined time period. Upon each lapse of the predetermined time period, the timer 401 notifies the signal generating circuit 402 that the predetermined time period has elapsed. In other words, the timer 401 reports a fixed cycle to the signal generating circuit 402.

Upon receiving each notification from the timer 401 that the predetermined time period has elapsed, the signal generating circuit 402 generates the control signals for switching output and non-output of the unique data from the target FPGA 100-1. To be specific, for example, the signal generating circuit 402 generates the ON signals that operate the output circuit 101 and the output amplifier 104a inside the FPGA 100-1. Upon the timer 401 counting the fixed cycle, the signal generating circuit 402 generates the OFF signals that stop the output circuit 101 and the output amplifier 104a inside the FPGA 100-1. In other words, upon receiving each notification from the timer 401, the signal generating circuit 402 inverts the generated control signals.

Because the signal generating circuit 402 generates the control signals while switching the control signals, the timer circuit 400 outputs the OFF signals to the FPGA 100-2 during the time period when outputting the ON signals to the FPGA 100-1, and outputs the ON signals to the FPGA 100-2 during the time period when outputting the OFF signals to the FPGA 100-1. Because the timer circuit 400 executes the switching mentioned above every time the timer 401 counts the fixed cycle, the computer terminal can reliably check the connections when data is output from the bi-directional pins and also when data is input into the bi-directional pins.

Apart from the circuits mentioned above, for example, if multiple output pins are connected to a single input pin, the computer terminal generates a sequential control circuit that exercises control such that the multiple output pins sequentially output the unique data. The output pins in the example mentioned earlier are formed of the tristate pins and the sequential control circuit controls the output pins to stop input/output of data from output pins other than the output pin that outputs the unique data.

Upon generating the checking circuits for each FPGA, the computer terminal implements the checking circuits to generate the ROM data and the generated ROM data is configured in all the FPGA including the other FPGA. Thus, the computer terminal executes the connection check for all the FPGA on the board and the other FPGA. After executing the connection check, upon ensuring that all the connections are non-defective, the computer terminal configures in each of the FPGAs on the board, the ROM data for carrying out functions equivalent to the functions of the desired ASIC, and verifies the logic. Because absence of a physical defect is ensured from the connection check, the computer terminal can verify the logic effectively.

According to the embodiment, the computer terminal retrieves from the pin data of the FPGA on the board, the connections between all the pins including the connections of the board with the external devices using the external connection pins of the FPGA. After differentiating between input and output, the computer terminal assigns the unique data to the connections between all the pins. Each FPGA uses the unique data to generate the ROM data for executing the connection check. Due to this, the unique data for the connection check is also assigned to the external connection pins and the unique data according to the input or the output is assigned to the bi-directional pins. Thus, the connection check can be executed based on the actual functions of all the input/output pins even if the programmable devices include a large number of the input/output pins.

According to an aspect of the present invention, connections related to all input/output pins are listed without any omission, and the connections can be checked by carrying out input/output of unique data similarly as an actual operation of each of pins. Thus, a connection check can be performed based on the actual functions of all the input/output pins even if programmable devices include a large number of the input/output pins.

According to another aspect of the present invention, by introducing other programmable devices, apart from checking the connections between the actually connected multiple programmable devices, connections to external programmable devices can also be checked.

According to still another aspect of the present invention, the connections can be reliably checked when bi-directional pins input data and also when the bi-directional pins output data.

According to still another aspect of the present invention, when the unique data, which is output from an output terminal by an output circuit of a destination terminal, is appropriately input from an input terminal, absence of a defect in the connection can be ensured.

According to still another aspect of the present invention, the connection check can also be carried out for the bi-directional pins by a simple method.

According to still another aspect of the present invention, the connection check is carried out while switching the input/output of the bi-directional pins each time. Thus, the connection check can be carried out based on the actual function of the bi-directional pins.

According to still another aspect of the present invention, the connection check is carried out while switching the input/output of the bi-directional pins for each predetermined time period. Thus, the connection check can be carried out based on the actual function of the bi-directional pins.

According to still another aspect of the present invention, even if a single pin is connected to a plurality of pins, the connection check can be reliably carried out without a collision of the unique data.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A method of generating checking data to be written to programmable devices for checking a connection between terminals of the programmable devices, the method comprising:
retrieving terminal data of the terminals of the programmable devices;
determining whether each of the terminals is an output terminal or an input terminal based on the terminal data;
determining whether each of the terminals is an external connection terminal to be coupled to an external device other than the programmable devices;
setting up an assumed terminal in the external device every time a terminal is determined to be the external connection terminal;
assigning unique data to the output terminal, and the assumed terminal coupled to the input terminal;
recording comparison data in association with information about the input terminal and the assumed terminal coupled to the output terminal, the comparison data being same as the unique data of a corresponding output terminal or a corresponding assumed terminal;
generating, for each of the programmable devices, a checking circuit that checks the connection between the terminals by comparing the unique data with the comparison data; and
generating the checking data corresponding to the checking circuit, wherein the generating the checking circuit includes
generating an output circuit that causes the unique data to be output from output terminals,
generating a comparing circuit that compares data input from input terminals with the comparison data, and
generating a timer circuit that switches, when a predetermined time elapses after the unique data is output from the output terminals, between the input direction and the output direction of the unique data of the bi-directional terminals.

2. The method according to claim 1, wherein the assigning includes assigning both the comparison data and the unique data for each of input connection and output connection to a bi-directional terminal, of the programmable devices, used for data input and data output.

3. The method according to claim 1, wherein the generating the checking circuit includes generating a direction determining circuit that determines an input/output direction of the unique data of the bi-directional terminals to be one of an input direction and an output direction.

4. The method according to claim 1, wherein the generating the checking circuit includes generating a control circuit that switches, when the comparing circuit performs a comparison, between the input direction and the output direction of the unique data of the bi-directional terminals.

5. The method according to claim 1, wherein the generating the checking circuit includes generating a sequence control circuit that causes, when a plurality of the output terminals are connected to one input terminal, the unique data to be sequentially output from the output terminals.

6. A connection checking system comprising:
a writing device that writes to programmable devices, checking data for checking a connection between terminals of the programmable devices; and
a plurality of the programmable devices that work based on the checking data, and that are connected to one another on a board, wherein the writing device includes
a retrieving unit that retrieves terminal data of terminals of the programmable devices,
a determining unit that determines whether each of the terminals is an output terminal or an input terminal based on the terminal data and determines whether each of the terminals is an external connection terminal to be coupled to an external device other than the programmable devices;
a setting up unit that sets up an assumed terminal in the external device every time a terminal is determined to be the external connection terminal by the determining unit;
an assigning unit that assigns unique data to the output terminal, and the assumed terminal coupled to the input terminal;
a recording unit that records comparison data in association with information about the input terminal and the assumed terminal coupled to the output terminal, the comparison data being same as the unique data of a corresponding output terminal or a corresponding assumed terminal;
a generating unit that generates, for each programmable device, a checking circuit that checks the connections between the terminals by comparing the unique data with the comparison data, and
a writing unit that writes to the programmable devices, the checking data corresponding to the checking circuit, wherein
the programmable devices check, based on the checking data, whether there is a failure in connections between terminals on the board, and
the generating unit generates
an output circuit that causes the unique data to be output from output terminals,
a comparing circuit that compares data input from input terminals with the comparison data, and
a timer circuit that switches, when a predetermined time elapses after the unique data is output from the output terminals, between the input direction and the output direction of the unique data of the bi-directional terminals.

7. A computer-readable recording medium that stores therein a computer program that causes a computer to generate checking data to be written to programmable devices for checking a connection between terminals of the programmable devices, the computer program causing the computer to execute:
retrieving terminal data of the terminals of the programmable devices;
determining whether each of the terminals is an output terminal or an input terminal based on the terminal data;
determining whether each of the terminals is an external connection terminal to be coupled to an external device other than the programmable devices;
setting up an assumed terminal in the external device every time a terminal is determined to be the external connection terminal;
assigning unique data to the output terminal, and the assumed terminal coupled to the input terminal;
recording comparison data in association with information about the input terminal and the assumed terminal coupled to the output terminal, the comparison data being same as the unique data of a corresponding output terminal or a corresponding assumed terminal;

generating, for each of the programmable devices, a checking circuit that checks the connection between the terminals by comparing the unique data with the comparison data; and generating the checking data corresponding to the checking circuit, wherein the generating the checking circuit includes generating an output circuit that causes the unique data to be output from output terminals, generating a comparing circuit that compares data input from input terminals with the comparison data, and generating a timer circuit that switches, when a predetermined time elapses after the unique data is output from the output terminals, between the input direction and the output direction of the unique data of the bi-directional terminals.

* * * * *